United States Patent [19]
Casper

[11] Patent Number: 6,115,307
[45] Date of Patent: *Sep. 5, 2000

[54] METHOD AND STRUCTURE FOR RAPID ENABLEMENT

[75] Inventor: Stephen L. Casper, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/858,532

[22] Filed: May 19, 1997

[51] Int. Cl.[7] .................................................... G11C 7/00
[52] U.S. Cl. ............................ 365/202; 365/226; 365/193
[58] Field of Search ....................... 711/105; 365/230.06, 365/233, 189.09, 185.21, 185.23–185.27, 193–196, 203–204, 226–227, 148–149, 202

[56] References Cited

U.S. PATENT DOCUMENTS

| | | | |
|---|---|---|---|
| 5,073,874 | 12/1991 | Yamada et al. | 365/226 |
| 5,204,837 | 4/1993 | Suwa et al. | 365/201 |
| 5,222,042 | 6/1993 | Ichiguchi | 365/189.01 |
| 5,270,977 | 12/1993 | Iwamoto et al. | 365/201 |
| 5,365,481 | 11/1994 | Sawada | 365/201 |
| 5,376,840 | 12/1994 | Nakayama | 327/537 |
| 5,552,739 | 9/1996 | Keeth et al. | 327/538 |
| 5,552,740 | 9/1996 | Casper | 327/541 |
| 5,557,579 | 9/1996 | Raad et al. | 365/226 |
| 5,644,215 | 7/1997 | Casper | 323/274 |
| 5,841,705 | 11/1998 | Hamamoto et al. | 365/198.09 |

*Primary Examiner*—John W. Cabeca
*Assistant Examiner*—Denise Tran
*Attorney, Agent, or Firm*—Schwegman, Lundberg, Woessner & Kluth, P.A.

[57] ABSTRACT

A method and apparatus of reducing the time for enabling a dynamic random access memory (DRAM) upon initial application of power, comprises generating an internal RAS signal upon initial power up to generate internal voltages. The internal RAS pulse is asserted after a short time delay ends. After the internal RAS pulse is asserted, voltages on a digit line pair are amplified with a sense amplifier. Then, the amplified voltages on the digit line pair are equilibrated with an equilibration circuit. The equilibrated voltage is also coupled through the equilibration circuit to charge a common plate of a memory cell capacitor.

20 Claims, 4 Drawing Sheets

METHOD AND STRUCTURE FOR RAPID ENABLEMENT

FIELD OF THE INVENTION

The present invention relates generally to memories, and more specifically to a method for reducing the time for initializing a memory upon power-up.

BACKGROUND OF THE INVENTION

When an integrated circuit, is turned on, internal circuitry must be initialized before the integrated circuit can operate properly and communicate with external circuitry. This requirement is particularly true for an integrated circuit that is a dynamic random access memory (DRAM).

Conventionally, DRAMs are initialized by precharging digit lines and capacitor electrodes with a voltage generator in a manner that is well known to persons skilled in the art. There are significant RC delays associated with precharging the digit lines and capacitor plates to a reference voltage with the voltage generator to permit normal operation. The external circuitry, such as a microprocessor, has to wait for these steps before accessing the DRAM. As a result, operations, such as mathematical manipulation of data from the DRAM, may be delayed. There is a need to more quickly enable, or power-up, the DRAM such that it is available for use more quickly upon power-up. There is a further need to accomplish a quicker initialization of the DRAM without the addition of complex, space consuming circuitry. There is yet a further need to more quickly initialize the DRAM safely such that it is enabled in a known state.

SUMMARY OF THE INVENTION

The present invention solves the above-mentioned problems in the art and other problems which will be understood by those skilled in the art upon reading and understanding the present specification. The present invention provides a method and apparatus for initializing a memory device. In particular, the present invention allows a dynamic random access memory (DRAM) device to be powered up more quickly by using amplifiers and equilibration circuits to assist a voltage generator in pre-charging memory cell capacitors and digit lines to a desired voltage prior to normal operation of the DRAM. When the capacitors and digit lines are initially charged, an internal RAS (Row Address Signal) pulse is generated to drive pairs of digit lines to opposite rails. The equilibration circuits then equalize the digit line pairs and assist in charging the memory cell capacitors. Because the sense amplifiers and equilibration circuits supply more current than the voltage generator, the digit lines and memory cell capacitors are charged to a voltage of Vcc/2 much more quickly than with the voltage generator alone.

In one embodiment, after one or more of the internal RAS pulses are asserted, voltages on a digit line pair are amplified with a sense amplifier to voltages of zero and Vcc. Then, the amplified voltages on the digit line pair are equilibrated with an equilibration circuit to equalize the voltages on the digit lines to Vcc/2. The equilibrated voltage is also coupled through the equilibration circuit to charge a common plate of the memory cell capacitors.

By using the sense amplifier and equilibration circuit to charge the digit lines and common plate, the enablement time of the memory is significantly reduced. In some instances, it can be reduced to less than one-half of a microsecond from 20 microseconds. Furthermore, no additional circuitry is required in existing DRAM designs to reduce enablement time. The sense amplifier and equilibration circuits are already used in DRAMs. Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the leftmost digit(s) of a reference number identifies the drawing in which the reference number first appears.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable persons skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present invention is defined only by the appended claims.

CONVENTIONAL DRAM OPERATION

Figure 1A:
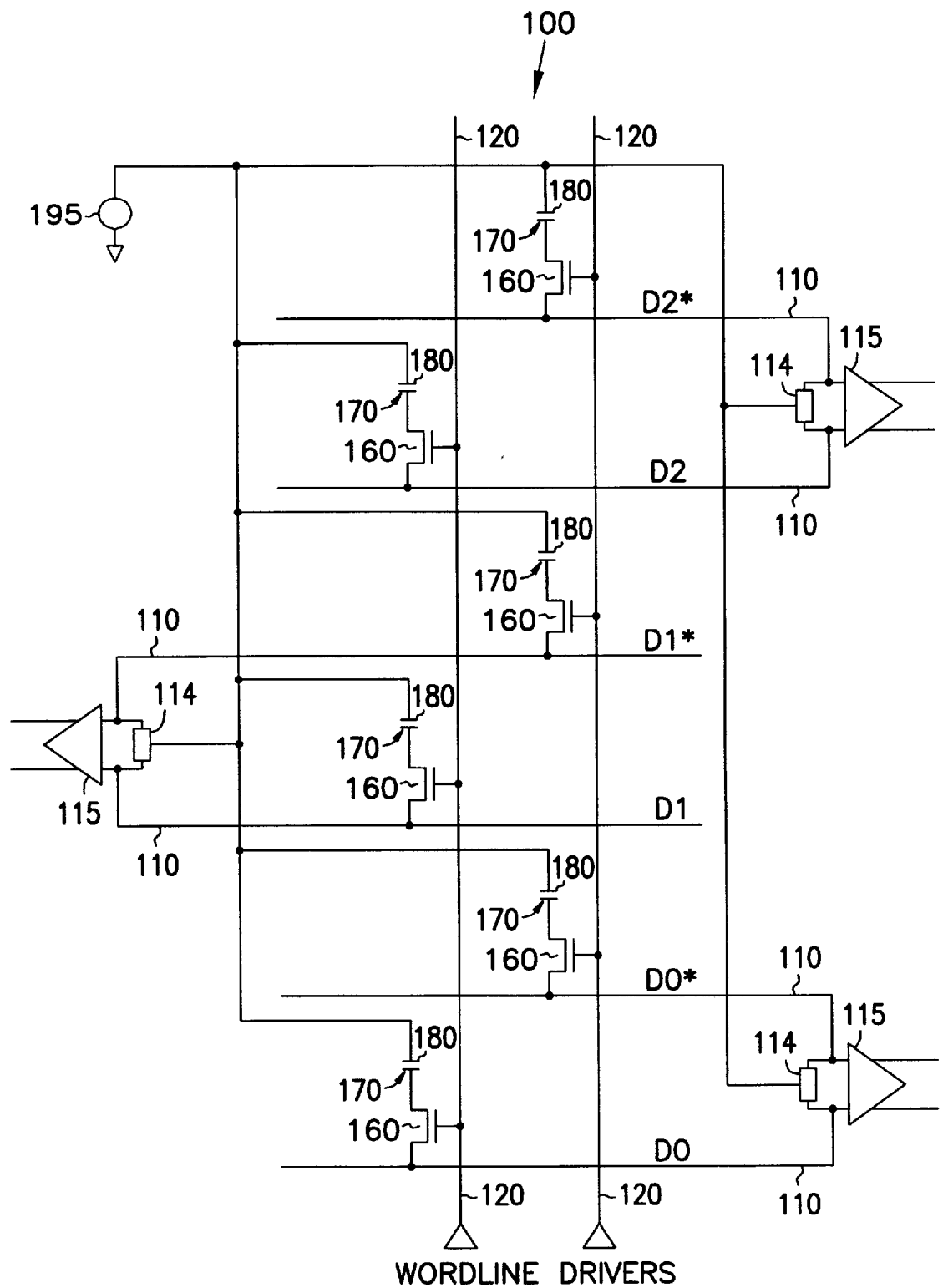
FIG. 1A is a schematic diagram of a prior art memory.

A memory 100, such as dynamic random access memory (DRAM) having a folded bit line architecture, is illustrated in prior art FIG. 1A. The memory 100 includes memory cells 180. Each memory 100 includes word lines 120 and digit lines 110 that are uniquely coupled to access transistors 160, such as field effect transistors. Each transistor 160 is coupled to one plate of a capacitor 170. The other capacitor plate 180 is generally common to all capacitors 170. The common plate 180 is coupled to a voltage generator 195 producing an output voltage of Vcc/2, also known as DVC2, which is one-half the Vcc voltage. The voltage generator 195 is also coupled to the digit lines 110 through equilibration circuits 114. Sense amplifiers 115 are coupled to digit line 110 pairs.

The equilibration circuits 114 are used to set the digit lines 110 at Vcc/2 prior to memory cell access and sensing. Thus, for proper operation of the memory circuit 100, it is vital that the digit line pairs be at the same voltage before the word line is enabled. The equilibration circuits are typically fabricated using transistors sized to have higher drive capability for rapid equilibration of the digit lines after memory cell access.

Figure 1B:
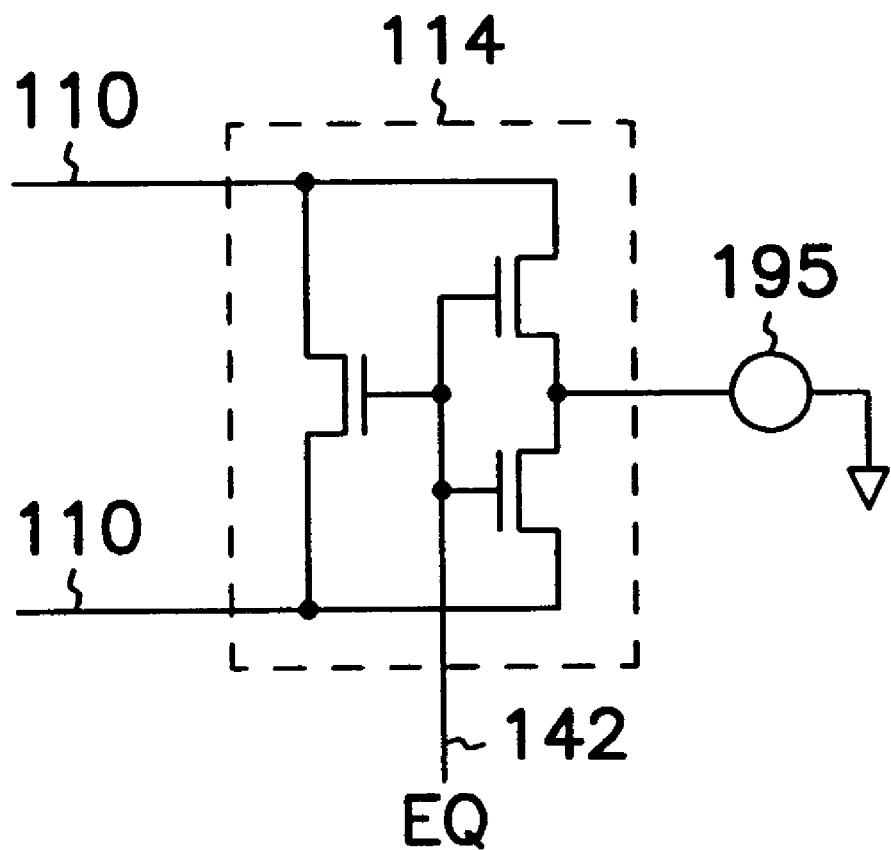
FIG. 1B is a schematic diagram of a prior art equilibration circuit.

One example of a prior art equilibration circuit 114 is illustrated in FIG. 1B. The equilibration circuit 114 is controlled by signal line EQ (EQuilibrate) 142. Signal EQ 142 is set active during memory power-up. As a result, the equilibration circuit 114 is activated, and couples the voltage generator 195 to the digit lines 110. Thus, in the prior art, the DVC2 voltage generator 195 supplies the drive current for equilibrating the digit lines.

The internal EQ signal is also used during normal operation of the memory circuit 100. Prior to a read or write access to the memory cells, the EQ signal is activated when the RAS signal is inactive. This indicates a precharge state for the memory circuit 100. When the memory cells are accessed, the EQ signal is set inactive before the RAS signal activates the word line drivers. After memory cell access, and after the RAS signal is again set inactive, the EQ signal is activated to once again equilibrate the digit lines.

Figure 2:
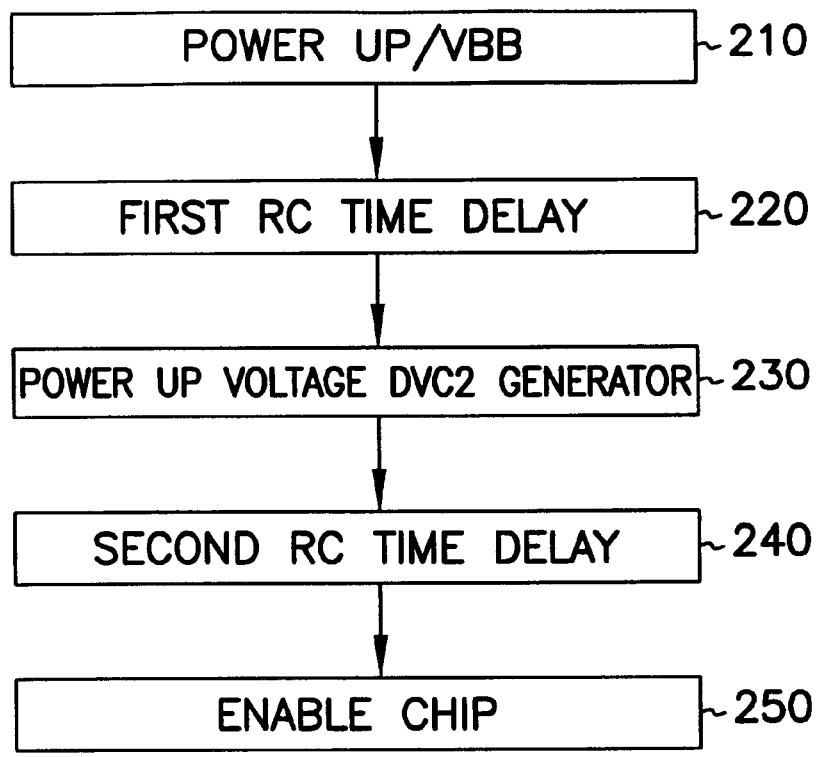
FIG. 2 is a prior art flow diagram of memory enablement.

Prior to the present invention, the memory 100 was enabled on power up by a method illustrated in FIG. 2. In step 210, initial power up of the device 100 is the application of $V_{CC}$ and $V_{SS}$ (ground) the device power inputs. The device then internally generates a negative substrate bias voltage $V_{BB}$ using a voltage pump circuit (not shown).

At step 220, a first RC time delay must be waited out before initialization of additional circuits within device 100. The first RC (a combination of resistance R and capacitance C) time delay is needed to allow for the initialization of the $V_{BB}$ charge pump circuit and the application of the substrate bias voltage. The first RC time delay is typically determined by simulation during circuit design, and then confirmed by experimentation, to ensure adequate charging of the substrate. As a result, the substrate voltage is stabilized.

At step 230, the DVC2 voltage generator 195 is powered up to produce $V_{CC}/2$ to begin precharging the digit lines. Then, a second RC time delay begins at step 240 to wait while the DVC2 voltage generator 195 charges the digit lines 110 and common plates 180 to Vcc/2. The second time delay ends when the digit lines 110 and common plates 180 are charged to the second voltage by the voltage generator. The second time delay is quite long relative to the first time delay due to the large amount of capacitance contributed by all of the digit lines 110 and common plates 180 in the DRAM. The second time delay is also first determined by simulation and then confirmed by experimentation. Finally, the memory 100 is enabled at step 250, and can interact with an external circuit. Typically, it takes up to 20 microseconds for the DVC2 voltage generator 195 to charge the digit lines 110. As a result, the DRAM may not enabled for 20 microseconds.

IMPROVED POWER UP INITIALIZATION

The present invention is directed toward reducing the time for enabling a memory 100. This goal is achieved by using existing circuitry other than the voltage generator to charge the digit lines 110 and common plates 180 to voltage Vcc/2 more quickly.

Figure 3:
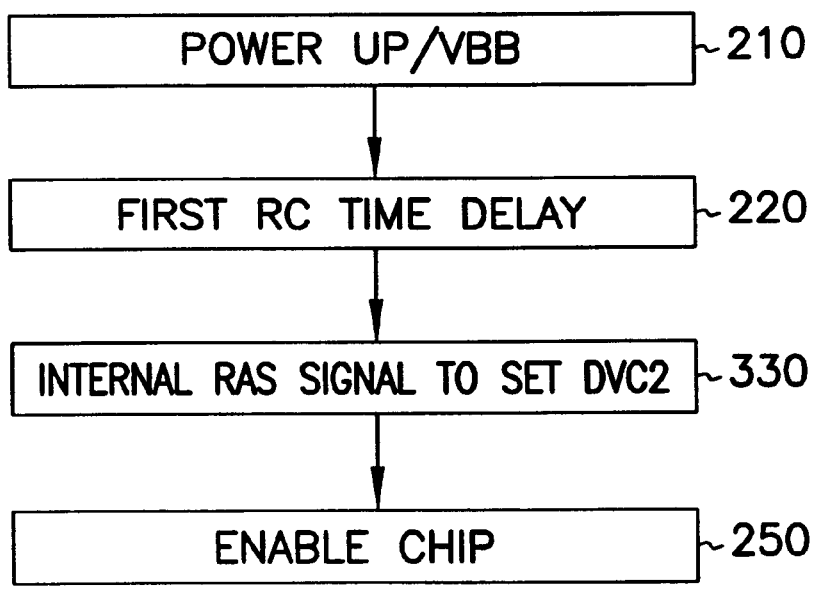
FIG. 3 is a flow diagram of one embodiment of memory enablement in accordance with the present invention.

FIG. 3 illustrates a flow chart of one embodiment of a method for more quickly enabling a memory 100. In step 210 of FIG. 3, initial power up of the device 100 is the application of $V_{CC}$ and $V_{SS}$ (ground) the device power inputs. The device then internally generates a negative substrate bias voltage $V_{BB}$ using a voltage pump circuit (not shown). Then at step 220 of FIG. 3, the first RC time delay occurs until the substrate bias voltage becomes stable. The first time delay ends or expires about when the substrate is charged to the proper bias voltage.

After the first RC time delay 220 ends, an internal Row Address Strobe (RAS) pulse is initiated or asserted in step 330 of the present invention. Methods of creating an internal RAS pulse (step 330) are known by persons skilled in the art. Typically, circuitry would be fabricated on the DRAM to create the internal RAS pulse.

The internal RAS pulse actuates existing sense amplifiers and equilibration circuits of the DRAM circuitry, described more fully below, which quickly precharge the digit lines 110 and common plates 180. Because this existing DRAM circuitry has higher current capacity than the voltage generator 195, the digit lines 110 and common plates 180 are more rapidly charged to voltage Vcc/2, and the DRAM is more quickly powered-up than with the prior art method.

NORMAL OPERATION USING THE RAS AND EQ SIGNALS

Figure 4:
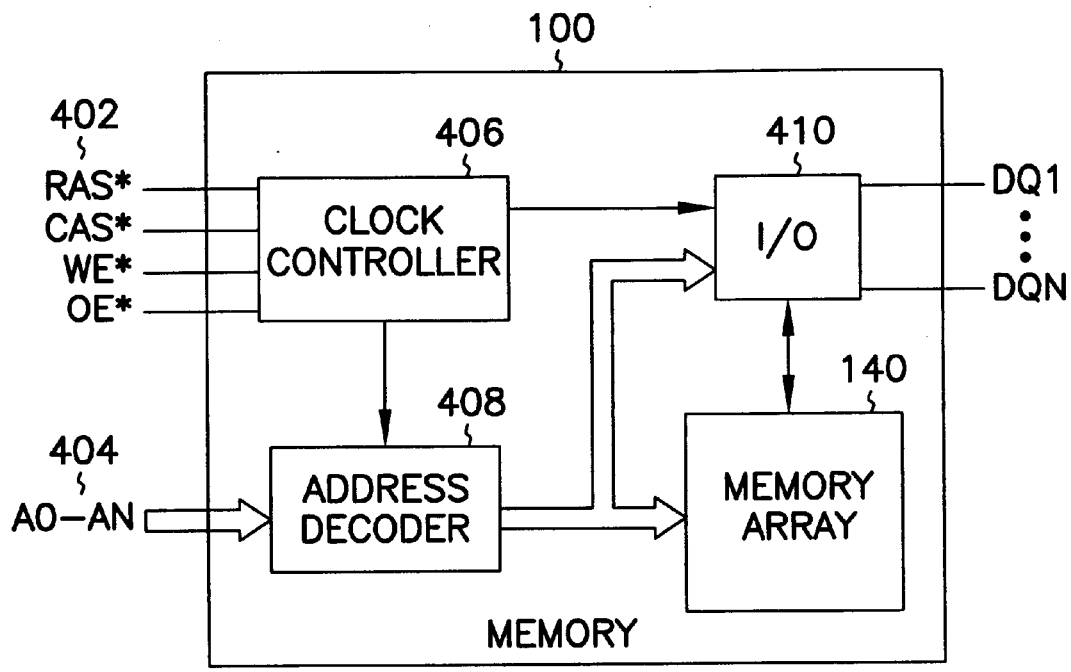
FIG. 4 is a block diagram of the memory enabled in the flow diagram of FIG. 3.
Figure 5:
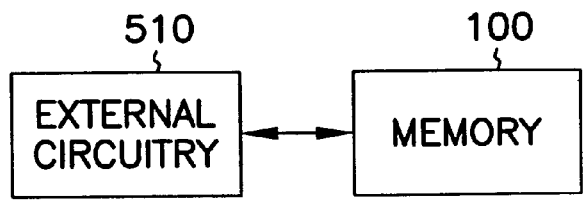
FIG. 5 is a block diagram of external circuitry coupled to the memory of FIG. 4.

In normal operation, an externally applied row address strobe complement (RAS*) signal 402 is typically applied to the memory 100 by external circuitry 510, as shown in FIG. 5. As shown in FIG. 4, the memory 100 comprises a clock controller 406, an address decoder 408, an I/O circuit 410, and memory cell array 140. The RAS* 402 is a logic signal that permits a row, or word line, to be addressed by external circuitry 510. When the external RAS* signal 402 transitions high, it causes a sense amplifier 115 and an equilibration circuit 114 to operate as subsequently described and as otherwise known to persons skilled in the art.

Initiation of the external RAS* signal 402 causes the sense amplifier 115 to amplify voltages on a corresponding digit line 110 pair. The sense amplifier 115 rapidly shifts the signals on the digit line 110 pair to complimentary voltages $V_{CC}$ and $V_{SS}$. The sense amplifiers are fabricated with transistors sized to be capable of rapid charging (Vcc) and discharging (Vss) of the complementary digit lines upon sensing. The internal EQ signal 142 is also transitioned active after the row address strobe transitions to an inactive state. As a result, the transistors 160 in the prior art equilibration circuit 114 of FIG. 1B are turned on. Thus, after RAS* 402 signal becomes inactive, and the internal EQ signal activates the equilibration circuits 114, the existing circuitry causes the equilibration of the digit lines on the pairs of digit lines 110 to $V_{cc}/2$. Thus, the sense amplifier 115 amplification and digit line 110 pair equilibration are conventionally performed during routine memory 100 operation to access memory cells.

POWER-UP USE OF THE INTERNAL RAS AND EQ SIGNALS

In the present invention during power up, the internally generated RAS signal causes the sense amplifiers and the equilibrate circuits to operate at step 330 of FIG. 3 in the same fashion as during routine operation described above. In essence, these circuits cause the rapid equilibration of the digit lines during power-up of the memory 100 on a global basis by equilibrating all digit lines simultaneously. The internal RAS pulse causes sequential activation of the sense amplifier 115 and equilibration circuit 114 in the manner described above. After performing the above described operation, the voltage Vcc/2 is maintained on the digit lines 110 and common plates 180 by the voltage generator, despite leakage paths in the memory 100. The Vcc/2 voltage is coupled through the equilibration circuit 114 to the common plates as shown in FIGS. 1A and 1B. The timing of the amplification and equilibration operations is based upon simulated and measured data to assure proper voltage levels are obtained prior to use.

In the case of very large memory arrays or segmented memory arrays with multiple internal buses, the entire chip may not be capable of initializing in a single or global internal RAS step. In this situation, multiple internal RAS signals may be used to initialize segments of the memory at a time. The time to equilibrate the entire memory is still reduced since the time to perform step 330 is still much smaller than the conventional steps 240 and 250 of FIG. 2.

Finally, after performing the above described operation, the memory 100 is enabled (step 250) so that the memory 100 can interact with the external circuitry 510, such as a microprocessor. When the memory 100 is enabled, a RAS buffer in the memory 100 is turned on so that the external circuitry 510 can address the cells of the memory 100. When the RAS buffer is turned on, the memory 100 will recognize a RAS from the external circuitry 510, which the memory 100 will not do when the RAS buffer is turned off.

The combination of the memory 100 and microprocessor may form a computer. By using the present invention, the power-up time of a memory 100 may be reduced to less than one-half of a microsecond.

CONCLUSION

Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. Therefore, it is manifestly intended that this invention be limited only by the claims and the equivalents thereof.

What is claimed is:

1. A method for rapidly initializing a memory device upon power-up, comprising:
   receiving initial application of power to the memory device; and
   asserting an internally generated RAS pulse to generate an internal voltage during initialization of the memory device, wherein the asserting further comprises generating a equilibrated voltage in response to the internal RAS pulse.

2. A method for rapidly initializing a memory device upon power-up, comprising:
   receiving initial application of power to the memory device; and
   asserting an internally generated RAS pulse to generate an internal voltage during initialization of the memory device wherein the asserting further comprises:
       accessing digit lines of a memory array to set the digit lines to either a first or second voltage;
       equilibrating the first and second voltage to produce an equilibrated voltage.

3. The method according to claim 2, wherein the equilibrating further comprises precharging a cell plate with the equilibrated voltage.

4. A method for rapidly powering-up a memory, comprising:
   receiving an initial application of power;
   asserting an internally generated RAS pulse after a first time delay during initialization of the memory;
   amplifying voltages on a digit line pair with a sense amplifier during initialization of the memory in response to the asserting of the internally generated RAS pulse;
   equilibrating the amplified voltages on the digit line pair with an equilibration circuit during initialization of the memory in response to the asserting of the internally generated RAS pulse; and
   charging a common plate of a memory cell capacitor to an equilibrated voltage on the digit line pair during initialization of the memory in response to the asserting of the internally generated RAS pulse.

5. The method according to claim 4 further comprising maintaining the equilibrated voltage on the digit line pair with a voltage generator.

6. The method according to claim 4, wherein the voltages on the digit line pair are amplified respectively to first and second voltages, and wherein the first and second voltages are equilibrated to an average of the first and second voltages.

7. A method for rapidly powering-up a dynamic random access memory (DRAM) comprising:
   receiving initial power indicative of a power up of the DRAM;
   generating a substrate bias voltage;
   applying the substrate bias voltage to a substrate;
   stabilizing the substrate bias voltage during a time delay;
   asserting an internally generated RAS pulse after the time delay ends during initialization of the DRAM;
   amplifying voltages on a digit line pair with a sense amplifier during initialization of the memory in response to the asserting of the internally generated RAS pulse;
   equilibrating the amplified voltages on the digit line pair with an equilibration circuit during initialization of the memory in response to the asserting of the internally generated RAS pulse; and
   charging a common plate of a memory cell capacitor to an equilibrated voltage on the digit line pair during initialization of the memory in response to the asserting of the internally generated RAS pulse.

8. The method according to claim 7 further comprising maintaining the equilibrated voltage on the digit line pair with a voltage generator.

9. The method according to claim 7, wherein the voltages on the digit line pair are amplified respectively to first and second voltages, and wherein the first and second voltages are equilibrated to an average of the first and second voltages.

10. A method for rapidly powering-up a memory, comprising:
    generating a substrate bias voltage to bias a substrate of the memory;
    applying the substrate bias voltage to the substrate of the memory;
    stabilizing the substrate bias voltage during a time delay;
    asserting an internally generated RAS pulse after the time delay ends during initialization of the memory;
    amplifying voltages on a digit line pair with a sense amplifier during initialization of the memory in response to the asserting of the internally generated RAS pulse;
    equilibrating the amplified voltages on the digit line pair with an equilibration circuit during initialization of the memory in response to the asserting of the internally generated RAS pulse;
    charging a common plate of a memory cell capacitor to an equilibrated voltage on the digit line pair to enable the memory to interact with external circuitry; and
    maintaining the equilibrated voltages on the digit line pair with a voltage generator.

11. The method according to claim 10, wherein the voltages on the digit line pair are amplified respectively to first and second voltages, and wherein the first and second voltages are equilibrated to the average of the first and second voltages.

12. A method for rapidly powering-up a computer, comprising:
applying power to a memory device in the computer;
asserting an internally generated RAS pulse after a time delay ends during initialization of the memory device;
amplifying voltages on a digit line pair with a sense amplifier during initialization of the memory device in response to the asserting of the internally generated RAS pulse;
equilibrating the amplified voltages on the digit line pair with an equilibration circuit during initialization of the memory device in response to the asserting of the internally generated RAS pulse; and
charging a common plate of a memory cell capacitor to an equilibrated voltage on the digit line pair to enable the memory device interact with the computer during initialization of the memory device in response to the asserting of the internally generated RAS pulse.

13. The method according to claim 12 further comprising maintaining the equilibrated voltage on the digit line pair with a voltage generator.

14. The method according to claim 12, wherein the voltages on the digit line pair are amplified respectively to second and third voltages, and wherein the second and third voltages are equilibrated to Vcc/2.

15. A method for rapidly powering-up a computer, comprising:
applying a voltage to a dynamic random access memory (DRAM) in the computer;
asserting an internally generated RAS pulse during initialization of the DRAM;
amplifying voltages on a digit line pair with a sense amplifier during initialization of the memory device in response to the asserting of the internally generated RAS pulse; and
equilibrating the amplified voltages on the digit line pair with an equilibration circuit during initialization of the memory device in response to the asserting of the internally generated RAS pulse.

16. The method according to claim 15 further including:
charging the common plate of a memory cell capacitor to the equilibrated voltage on the digit line pair to enable the DRAM to interact with the computer; and
maintaining the equilibrated voltage on the digit line pair with a voltage generator.

17. The method according to claim 16, wherein the voltages on the digit line pair are amplified respectively to first and second, and wherein the first and second voltages are equilibrated to a mid-point between the first and second voltages.

18. A dynamic random access memory (DRAM), comprising:
a clock controller;
an address decoder operatively coupled to the clock controller;
an I/O circuit operatively coupled to the clock controller and address decoder; and
a memory array, operatively coupled to the I/O circuit and the address decoder, comprising:
digit line pair;
an internal row address signal (RAS) generator operable to produce an internal RAS in response to an initial power on condition;
a sense amplifier that upon an occurrence of an internal RAS pulse during the initial power on condition drives the digit line pair to opposite rails; and
an equilibration circuit that upon the occurrence of the internal RAS pulse during the initial power on condition equilibrates voltages on the digit line pair to Vcc/2 and permits a common capacitor plate to charge to Vcc/2.

19. The DRAM according to claim 18 further comprising a voltage generator operatively coupled to the digit line pair.

20. A dynamic random access memory (DRAM), comprising:
a clock controller;
an address decoder operatively coupled to the clock controller;
an I/O circuit operatively coupled to the clock controller and address decoder; and
a memory array, operatively coupled to the I/O circuit and the address decoder, comprising:
a voltage generator for providing a stable Vcc/2;
a digit line pair;
a sense amplifier that upon an occurrence on an internally generated RAS pulse during initialization of the DRAM drives the digit line pair to opposite rails; and
an equilibration circuit that upon the occurrence of the internal RAS pulse during the initial power on condition equilibrates voltages on the digit line pair to Vcc/2 to assist the voltage generator in charging a common capacitor plate to Vcc/2 so that the DRAM is enabled for normal operation.

* * * * *